United States Patent
Spitsberg et al.

(10) Patent No.: US 7,166,373 B2
(45) Date of Patent: *Jan. 23, 2007

(54) CERAMIC COMPOSITIONS FOR THERMAL BARRIER COATINGS WITH IMPROVED MECHANICAL PROPERTIES

(75) Inventors: Irene Spitsberg, Loveland, OH (US); Brett Allen Boutwell, Liberty Township, OH (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/921,515

(22) Filed: Aug. 19, 2004

(65) Prior Publication Data

US 2006/0040127 A1    Feb. 23, 2006

(51) Int. Cl.
*B32B 9/00*    (2006.01)

(52) U.S. Cl. .................. 428/702; 428/688; 428/689; 427/248.1; 416/241 R

(58) Field of Classification Search ............... 428/632, 428/633, 697, 699, 701, 702, 336; 416/241 B; 427/453, 585, 584, 250, 421; 501/103, 104, 501/105
See application file for complete search history.

(56) References Cited

U.S. PATENT DOCUMENTS

| | | | |
|---|---|---|---|
| 4,753,902 A | 6/1988 | Ketcham | |
| 5,180,696 A | 1/1993 | Inoue | |
| 5,350,599 A | 9/1994 | Rigney et al. | |
| 5,384,200 A | 1/1995 | Giles et al. | |
| 5,705,231 A | 1/1998 | Nissley et al. | |
| 5,789,330 A | 8/1998 | Kondo et al. | |
| 5,824,089 A | 10/1998 | Rieger | |
| 5,942,334 A | 8/1999 | Wortman | |
| 5,981,088 A | 11/1999 | Bruce et al. | |
| 6,025,078 A | 2/2000 | Rickerby et al. | |
| 6,054,184 A | 4/2000 | Bruce et al. | |
| 6,117,560 A | 9/2000 | Maloney | |
| 6,123,997 A | 9/2000 | Schaeffer et al. | |
| 6,183,884 B1 | 2/2001 | Rickerby | |

(Continued)

OTHER PUBLICATIONS

Nakayama et al., "Effect of $La_2O_3$ Addition on Thermal Stability of Y-TZP," J. Mat. Sci. Lett., 18:1339-41 (1999).

(Continued)

*Primary Examiner*—Jennifer C. McNeil
*Assistant Examiner*—Elizabeth D. Ivey
(74) *Attorney, Agent, or Firm*—Eric W. Guttag; Jagtiani +Guttag; Ted Cummings

(57) ABSTRACT

Zirconia-containing ceramic compositions useful for thermal barrier coatings having improved mechanical properties, especially improved fracture toughness. These compositions comprise: (1) at least about 93 mole % zirconia; (2) a stabilizing amount up to about 5 mole % of a stabilizer metal oxide selected from the group consisting of yttria, calcia, ceria, scandia, magnesia, india, gadolinia, neodymia, samaria, dysprosia, erbia, ytterbia, europia, praseodymia, and mixtures thereof, and a fracture toughness improving amount up to about 2 mole % lanthana. These ceramic compositions can be used to prepare thermal barrier coatings to provide a thermally protected article having a substrate and optionally a bond coat layer adjacent to and overlaying the substrate. The thermal barrier coating can be prepared by depositing the ceramic composition on the bond coat layer or the substrate in the absence of a bond coat layer.

22 Claims, 1 Drawing Sheet

U.S. PATENT DOCUMENTS

| | | | |
|---|---|---|---|
| 6,284,325 | B1 | 9/2001 | Eaton, Jr. et al. |
| 6,319,614 | B1 | 11/2001 | Beele |
| 6,333,118 | B1 | 12/2001 | Alperine et al. |
| 6,352,788 | B1 | 3/2002 | Bruce |
| 6,387,526 | B1 | 5/2002 | Beele |
| 6,465,090 | B1 | 10/2002 | Stowell et al. |
| 6,858,334 | B1 * | 2/2005 | Gorman et al. ............. 428/701 |
| 6,887,595 | B1 * | 5/2005 | Darolia et al. ............. 428/701 |
| 2002/0172838 | A1 | 11/2002 | Rigney et al. |
| 2003/0049470 | A1 | 3/2003 | Maloney |
| 2003/0059633 | A1 | 3/2003 | Ackerman et al. |
| 2003/0224200 | A1 * | 12/2003 | Bruce ...................... 428/632 |

OTHER PUBLICATIONS

Vassen et al., "Zirconates as New Materials for Thermal Barrier Coatings," J. Am. Ceram. Soc., 83(8):2023-28 (2000).
Chen et al, "Mechanisms Governing the High Temperature Erosion of Thermal Barrier Coatings," Wear, 256:735-46 (2004).
U.S. Appl. No. 10/748,516, filed Dec. 30, 2003, Gorman et al.
U.S. Appl. No. 10/748,517, filed Dec. 30, 2003, Boutwell et al.
U.S. Appl. No. 10/748,519, filed Dec. 30, 2003, Darolia et al.
U.S. Appl. No. 10/748,508, filed Dec. 30, 2003, Spitsberg et al.
U.S. Appl. No. 10/748,520, filed Dec. 30, 2003, Spitsberg et al.
U.S. Appl. No. 10/748,521, filed Dec. 30, 2003, Spitsberg et al.
U.S. Appl. No. 10/748,518, filed Dec. 30, 2003, Spitsberg et al.
U.S. Appl. No. 10/748,513, filed Dec. 30, 2003, Spitsberg et al.
U.S. Appl. No. 10/830,685, filed Apr. 21, 2004, Gorman et al.

* cited by examiner

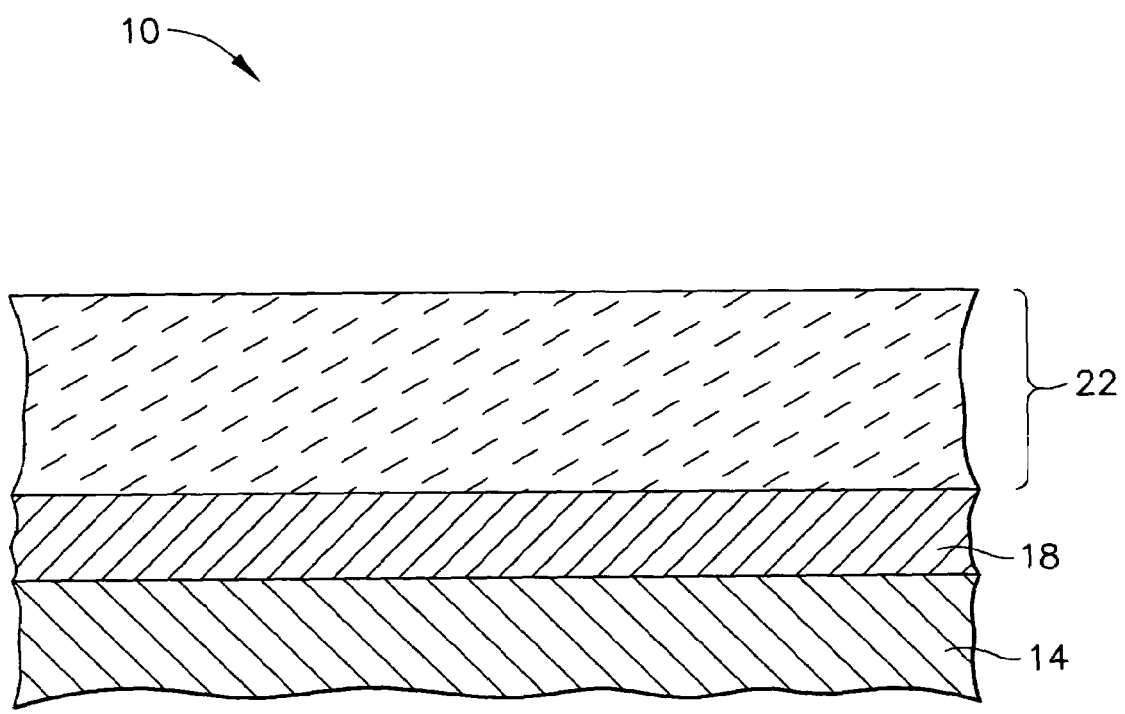

CERAMIC COMPOSITIONS FOR THERMAL BARRIER COATINGS WITH IMPROVED MECHANICAL PROPERTIES

STATEMENT REGARDING FEDERALLY SPONSORED RESEARCH

This invention was made with Government support under Contract No. N00019-96-C-0176 awarded by the JSF Program Office. The Government has certain rights to the invention.

BACKGROUND OF THE INVENTION

This invention relates to zirconia-containing ceramic compositions useful for thermal barrier coatings having improved mechanical properties, especially improved fracture toughness, by including small amounts of lanthana. This invention further relates to coatings prepared from such compositions, articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coatings are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine blades and vanes, turbine shrouds, buckets, nozzles, combustion liners and deflectors, and the like. These thermal barrier coatings typically comprise the external portion or surface of these components and are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

The thermal barrier coating is usually prepared from a ceramic material, such as a chemically (metal oxide) phase-stabilized zirconia. Examples of such chemically phase-stabilized zirconias include yttria-stabilized zirconia, scandia-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia. The thickness of the thermal barrier coating depends upon the metal substrate part or component it is deposited on, but is usually in the range of from about 3 to about 70 mils (from about 76 to about 1788 microns) thick for high temperature gas turbine engine parts.

Although significant advances have been made in improving the durability of thermal barrier coatings for turbine engine components, such coatings are still susceptible to various types of damage, including objects ingested by the engine, erosion, oxidation, and attack from environmental contaminants. Impact damage caused by such ingested objects can eventually cause spallation and loss of the thermal barrier coating.

Accordingly, it would be desirable to improve the impact resistance and fracture toughness of such thermal barrier coatings, especially at higher temperatures that most turbine components are subjected to, so that the coating is less susceptible to damage due to objects and debris ingested by the engine and passing through the turbine sections thereof.

BRIEF DESCRIPTION OF THE INVENTION

An embodiment of this invention relates to zirconia-containing ceramic compositions for preparing a thermal barrier coating having improved mechanical properties, especially improved impact resistance and fracture toughness, that also provides reduced thermal conductivity for an underlying substrate of articles that operate at, or are exposed to, high temperatures. These compositions comprise:
1. at least about 93 mole % zirconia;
2. a stabilizing amount up to about 5 mole % of a stabilizer metal oxide selected from the group consisting of yttria, calcia, ceria, scandia, magnesia, india and mixtures thereof; and
3. a fracture toughness improving amount up to about 2 mole % lanthana.

Another embodiment of this invention relates to a thermally protected article. This protected article comprises:
A. a substrate;
B. optionally a bond coat layer adjacent to and overlaying the metal substrate; and
C. a thermal barrier coating (prepare from the ceramic composition previously described) adjacent to and overlaying the bond coat layer (or overlaying the substrate if the bond coat layer is absent).

Another embodiment of this invention relates to a method for preparing the thermal barrier coating on a metal substrate to provide a thermally protected article. This method comprises the steps of:
A. optionally forming a bond coat layer on the substrate;
B. depositing on the bond coat layer (or on the metal substrate in the absence of the bond coat layer) the ceramic composition previously described to form the thermal barrier coating.

The zirconia-containing ceramic compositions of this invention can be used to improve the mechanical properties of thermal barrier coatings for substrates of articles exposed to high temperatures, such as turbine components. The thermal barrier coatings prepared from these zirconia-containing ceramic compositions particularly provide improved impact resistance and fracture toughness properties. This improvement in impact resistance and fracture toughness properties for the thermal barrier coating can be achieved while allowing flexibility to use a variety of zirconia-containing ceramic compositions that can impart to the thermal barrier coating desirable reduced thermal conductivity properties, while also providing reduced or lowered thermal conductivity benefits for the substrate over time and during exposure to higher temperatures, as well as temperature cycling.

BRIEF DESCRIPTION OF THE DRAWINGS

The FIGURE is a partial side sectional view of an embodiment of the thermal barrier coating and coated article of this invention.

DETAILED DESCRIPTION OF THE INVENTION

As used herein, the term "zirconia-containing ceramic compositions" refers to ceramic compositions where zirconia is the primary component that are useful as thermal barrier coatings that are capable of reducing heat flow to the substrate (e.g., metal substrate) of the article, i.e., forming a thermal barrier, and which have a melting point that is typically at least about 2600° F. (1426° C.), and more typically in the range of from about 3450° to about 4980° F. (from about 1900° to about 2750° C.).

As used herein, the term "fracture toughness" refers to the measurement of the resistance of the specimen being tested to extension of a crack. See Davis, ASM Materials Engineering Dictionary (1992), p. 175.

As used herein, the term "FCT" refers to the Furnace Cycle Test. FCT measures the resistance to spallation of the thermal barrier coating under temperature cycling and is an indirect measure of the fracture toughness of the coating.

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are by mole % unless otherwise specified.

Suitable zirconia-containing compositions include those which comprise at least about 93 mole % zirconia, and typically from about 93 to about 95.5 mole % zirconia, more typically from about 94 to about 95 mole % zirconia. These zirconia-containing compositions further comprise a stabilizing amount of stabilizer metal oxide selected from the group consisting of yttria, calcia, scandia, magnesia, india, gadolinia, neodymia, samaria, dysprosia, erbia, ytterbia, europia, praseodymia, and mixtures thereof. The particular amount of this metal oxide that is "stabilizing" will depend on a variety of factors, including the metal oxide used and the erosion and impact resistance. Typically, the stabilizer metal oxide comprises from about 3 to about 5 mole %, more typically from about 4 to about 5 mole %, of the composition. The zirconia-containing ceramic compositions used herein typically comprise yttria as the stabilizer metal oxide.

While these zirconia-containing ceramic compositions provide thermal barrier coatings having reduced thermal conductivity, it is desirable to balance this reduced thermal conductivity with other mechanical properties, including impact resistance and spallation life of the thermal barrier coating. For this purpose, the zirconia-containing ceramic compositions of this invention further include a relatively small amount of lanthana up to about 2 mole % and sufficient to improve fracture toughness. When included above about 2 mole %, lanthana-zirconate phases can form that can adversely affect the mechanical properties, including fracture toughness, of the resulting thermal barrier coating. Typically, lanthana is included in the zirconia-containing ceramic compositions of this invention in an amount in the range of from about 0.1 to about 2 mole %, more typically from about 1 to about 2 mole %.

The ability of small amounts of lanthana to improve fracture toughness (as measured by the FCT life which is determined by the correct propagation in the thermal barrier coating above the thermal barrier coating/bond coat interface due to thermal fatigue conditions) of the thermal barrier coating prepared from zirconia-containing ceramic compositions is shown in the following Table 1:

TABLE 1

| Sample* | FCT Life (No. of Cycles) |
|---|---|
| 4.6% (1.9 mole %) lanthana + 7% (3.95 mole %) YSZ | 480** |
| 4.0% (1.6 mole %) lanthana + 4% (2.3 mole %) YSZ | 326.7** |
| 7% (3.95 mole %) YSZ | 230 ± 40 |

*YSZ = Yttria-Stabilized Zirconia
**Average of 3 tests

In the FCT testing above, each thermal cycle consists of 5 minutes heating the sample up to a peak temperature of about 2125° F. (1163° C.), holding the sample at this peak temperature for 45 minutes, and cooling down the sample over a 10 minute period to ambient temperature.

Thermal barrier coatings prepared from the ceramic compositions of this invention are useful with a wide variety of turbine engine (e.g., gas turbine engine) parts and components that are formed from substrates, typically metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, turbine nozzles, combustor components such as liners and deflectors, augmentor hardware of gas turbine engines and the like. The thermal barrier coatings of this invention can also cover a portion or all of the metal substrate. For example, with regard to airfoils such as blades, the thermal barrier coatings of this invention are typically used to protect, cover or overlay portions of the metal substrate of the airfoil rather than the entire component, e.g., the thermal barrier coatings cover the leading and trailing edges and other surfaces of the airfoil, but not the attachment area. While the following discussion of the thermal barrier coatings of this invention will be with reference to metal substrates of turbine engine parts and components, it should also be understood that the thermal barrier coatings of this invention are useful with metal substrates of other articles that operate at, or are exposed to, high temperatures.

The various embodiments of the thermal barrier coatings of this invention are further illustrated by reference to the drawings as described hereafter. Referring to the drawings, the FIGURE shows a partial side sectional view of an embodiment of the thermal barrier coating used with the metal substrate of an article indicated generally as 10. As shown in the FIGURE, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417–479 (1980), and Vol. 15, pp. 787–800 (1981). Illustrative high temperature nickel-based alloys are designated by the trade names Inconel®, Nimonic®, Rene® (e.g., Rene® 80, Rene® N5 alloys), and Udimet®. As described above, the type of substrate 14 can vary widely, but it is representatively in the form of a turbine part or component, such as an airfoil (e.g., blade) or turbine shroud.

As shown in the FIGURE, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, or NiAl(Zr) compositions, as well as various noble metal diffusion aluminides such as platinum aluminide, as well as simple aluminides (i.e., those formed without noble metals). This bond coat layer 18 can be applied, deposited or otherwise formed on substrate 10 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and U.S. Pat. No. 6,039,810 (Mantkowski et al), issued Mar. 21, 2000, all of which are incorporated by reference and which disclose various apparatus and methods for applying diffusion aluminide coatings, or combinations of such techniques, such as, for example, a combination of plasma spray and diffusion aluminide techniques). Typically, plasma spray or diffusion techniques are employed to deposit bond coat layer 18. Usually, the deposited bond coat layer 18 has a thickness in the range of from about 1 to about 20 mils (from about 25 to about 508 microns). For bond coat layers 18 deposited by PVD techniques such as EDPVD or diffusion aluminide processes, the thickness is more typically in the range of from about 1 about 3 mils (from about 25 to about 76 microns). For bond coat layers deposited by plasma spray techniques such as APS, the thickness is more typically in the range of from about 3 to about 15 mils (from about 76 to about 381 microns).

As shown in the FIGURE, thermal barrier coating (TBC) 22 prepared from the ceramic composition of this invention is adjacent to and overlies bond coat layer 18. The thickness of TBC 22 is typically in the range of from about 1 to about 100 mils (from about 25 to about 2540 microns) and will depend upon a variety of factors, including the article 10 that is involved. For example, for turbine shrouds, TBC 22 is typically thicker and is usually in the range of from about 30 to about 70 mils (from about 762 to about 1788 microns), more typically from about 40 to about 60 mils (from about 1016 to about 1524 microns). By contrast, in the case of turbine blades, TBC 22 is typically thinner and is usually in the range of from about 1 to about 30 mils (from about 25 to about 762 microns), more typically from about 3 to about 20 mils (from about 76 to about 508 microns).

In forming TBCs 22, the ceramic compositions of this invention can be applied, deposited or otherwise formed on bond coat layer 18 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray; chemical vapor deposition (CVD), or combinations of plasma spray and CVD techniques. The particular technique used for applying, depositing or otherwise forming TBC 22 will typically depend on the composition of TBC 22, its thickness and especially the physical structure desired for TBC 22. For example, PVD techniques tend to be useful in forming TBCs having a strain-tolerant columnar structure. By contrast, plasma spray techniques (e.g., APS) tend to create a splat-layered porous structure. TBC 22 is typically formed from ceramic compositions of this invention by PVD, and especially EB-PVD techniques to provide a strain-tolerant columnar structure.

Various types of PVD and especially EB-PVD techniques well known to those skilled in the art can also be utilized to form TBCs 22 from the ceramic compositions of this invention. See, for example, U.S. Pat. No. 5,645,893 (Rickerby et al), issued Jul. 8, 1997 (especially col. 3, lines 36–63); U.S. Pat. No. 5,716,720 (Murphy), issued Feb. 10, 1998) (especially col. 5, lines 24–61); and U.S. Pat. No. 6,447,854 (Rigney et al), issued Sep. 10, 2002, which are all incorporated by reference. Suitable EB-PVD techniques for use herein typically involve a coating chamber with a gas (or gas mixture) that preferably includes oxygen and an inert gas, though an oxygen-free coating atmosphere can also be employed. The ceramic coating compositions are then evaporated with electron beams focused on, for example, ingots of the ceramic coating compositions so as to produce a vapor of metal ions, oxygen ions and one or more metal oxides. The metal and oxygen ions and metal oxides recombine to form TBC 22 on the surface of metal substrate 14, or more typically on bond coat layer 18.

Various types of plasma-spray techniques well known to those skilled in the art can also be utilized to form TBCs 22 from the ceramic compositions of this invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The ceramic coating composition, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the ceramic coating composition particles flowing into the plasma plume (or plasma "jet") is another parameter which is usually controlled very closely. Suitable plasma spray systems are described in, for example, U.S. Pat. No. 5,047,612 (Savkar et al) issued Sep. 10, 1991, which is incorporated by reference.

While specific embodiments of this invention have been described, it will be apparent to those skilled in the art that various modifications thereto can be made without departing from the spirit and scope of this invention as defined in the appended claims.

What is claimed is:

1. An article, which comprises a thermal barrier coating which consists essentially of:
   1. at least about 93 mole % zirconia;
   2. a stabilizing amount up to about 5 mole % of a stabilizer metal oxide selected from the group consisting yttria, calcia, ceria, scandia, magnesia, india, gadolinia, neodymia, samaria, dysprosia, erbia, ytterbia, europia, praseodymia, and mixtures thereof; and
   3. a fracture toughness improving amount of from about 1 to about 2 mole % lanthana.

2. The article of claim 1 wherein the thermal barrier coating consists essentially of from about 93 to about 95.5 mole % zirconia.

3. The article of claim 2 wherein the thermal barrier coating consists essentially of from about 3 to about 5 mole % stabilizer metal oxide.

4. The article of claim 3 wherein the thermal barrier coating consists essentially of from about 4 to about 5 mole % stabilizer metal oxide.

5. The article of claim 4 wherein the stabilizer metal oxide is yttria.

6. The article of claim 1 wherein the thermal barrier coating consists essentially of from about 94 to about 95 mole % zirconia.

7. A thermally protected article, which comprises:
   A. a substrate; and
   B. a thermal barrier coating consisting essentially of:
      1. at least about 93 mole % zirconia; and
      2. a stabilizing amount up to about 5 mole % of a stabilizing metal oxide selected from the group consisting of yttria, calcia, ceria, scandia, magnesia, india, gadolinia, neodymia, samaria, dysprosia, erbia, ytterbia, europia, praseodymia, and mixtures thereof; and
      3. a fracture toughness improving amount of from about 1 to about 2 mole % lanthana.

8. The article of claim 7 wherein the substrate is a metal substrate, wherein the article further comprises a bond coat layer adjacent to and overlaying the metal substrate and wherein the thermal barrier coating is adjacent to and overlies the bond coat layer.

9. The article of claim 8 wherein the thermal barrier coating has a thickness of from about 1 to about 100 mils.

10. The article of claim 9 wherein the thermal barrier coating consists essentially of from about 93 to about 95.5 mole % zirconia.

11. The article of claim 10 wherein the thermal barrier coating consists essentially of from about 94 to about 95 mole % zirconia.

12. The article of claim 9 which is a turbine engine component.

13. The article of claim 12 which is a turbine shroud and wherein the thermal barrier coating has a thickness of from about 30 to about 70 mils.

14. The article of claim 12 which is a turbine airfoil and wherein the thermal barrier coating has a thickness of from about 3 to about 15 mils.

15. The article of claim 9 wherein the thermal barrier coating consists essentially of from about 3 to about 5 mole % stabilizer metal oxide.

16. The article of claim 15 wherein the thermal barrier coating consists essentially of from about 4 to about 5 mole % stabilizer metal oxide.

17. The article of claim 16 wherein the stabilizer metal oxide is yttria.

18. A method for preparing a thermal barrier coating for an underlying substrate, the method comprising the step of:
   a. depositing over the substrate a zirconia-containing ceramic composition to form a thermal barrier coating, the zirconia-containing ceramic composition consisting essentially of:
      1. at least about 93 mole % zirconia; and
      2. a stabilizing amount up to about 5 mole % of a stabilizer metal oxide selected from the group consisting of yttria, calcia, ceria, scandia, magnesia, india, gadolinia, neodymia, samaria, dysprosia, erbia, ytterbia, europia, praseodymia, and mixtures thereof; and
      3. a fracture toughness improving amount of from about 1 to about 2 mole % lanthana.

19. The method of claim 18 wherein the substrate is a metal substrate, wherein a bond coat layer is adjacent to and overlies the metal substrate and wherein the thermal barrier coating is formed on the bond coat layer.

20. The method of claim 19 wherein the ceramic composition is deposited by physical vapor deposition to form a thermal barrier coating having a strain-tolerant columnar structure.

21. The method of claim 20 wherein the ceramic composition deposited consists essentially of from about 93 to about 95.5 mole % zirconia.

22. The method of claim 21 wherein the ceramic composition deposited consists essentially of from about 3 to about 5 mole % yttria as a stabilizer metal oxide.

* * * * *